US012695449B2

(12) United States Patent
Yang et al.

(10) Patent No.: US 12,695,449 B2
(45) Date of Patent: Jul. 28, 2026

(54) INTEGRATED CIRCUIT, ASSOCIATED START-UP CIRCUIT AND START-UP METHOD THEREOF

(71) Applicant: Chengdu Monolithic Power Systems Co., Ltd., Chengdu (CN)

(72) Inventors: Xiangyi Yang, Chengdu (CN); Wei Mao, Chengdu (CN)

(73) Assignee: Chengdu Monolithic Power Systems Co., Ltd., Sichuan (CN)

( * ) Notice: Subject to any disclaimer, the term of this patent is extended or adjusted under 35 U.S.C. 154(b) by 29 days.

(21) Appl. No.: 18/796,100

(22) Filed: Aug. 6, 2024

(65) Prior Publication Data

US 2025/0055422 A1 Feb. 13, 2025

(30) Foreign Application Priority Data

Aug. 8, 2023 (CN) .......................... 202310995140.6

(51) Int. Cl.
*H03K 17/10* (2006.01)
*H03K 17/082* (2006.01)

(52) U.S. Cl.
CPC ......... *H03K 17/102* (2013.01); *H03K 17/107* (2013.01); *H03K 17/0822* (2013.01); *H03K 2217/94047* (2013.01)

(58) Field of Classification Search
None
See application file for complete search history.

(56) References Cited

U.S. PATENT DOCUMENTS

| | | | | |
|---|---|---|---|---|
| 9,025,348 | B2 * | 5/2015 | Ozawa | H02M 3/33523 |
| | | | | 363/21.18 |
| 9,276,569 | B2 * | 3/2016 | Ikeda | H03K 17/102 |
| 10,673,396 | B1 * | 6/2020 | Dodge | H03F 3/1935 |
| 11,489,439 | B1 * | 11/2022 | Tang | H02H 9/042 |
| 2024/0162898 | A1 * | 5/2024 | Pala | H03K 17/567 |

* cited by examiner

*Primary Examiner* — Thomas J. Hiltunen
(74) *Attorney, Agent, or Firm* — Ashurst Perkins Coie US LLP

(57) ABSTRACT

An integrated circuit for a switching power supply circuit has an enable pin, a power supply pin, a switch pin, a ground pin, a power switch and an amplifier. The enable pin receives an enable signal. The power supply pin is coupled to a power supply capacitor. The switch pin receives an input voltage. The power switch has a normally-on switching device and a normally-off switching device. A first terminal of the normally-on switching device is coupled to the switch pin. A first terminal of the normally-off switching device is coupled to a second terminal of the normally-on switching device, a second terminal of the normally-off switching device is coupled to the ground pin. The amplifier provides an amplified signal based on a difference between a voltage at the power supply pin and a voltage at the second terminal of the normally-on switching device to control the normally-on switching device.

20 Claims, 5 Drawing Sheets

100

J1

M1

200

SW

J1

VCC

C1

M1

GND

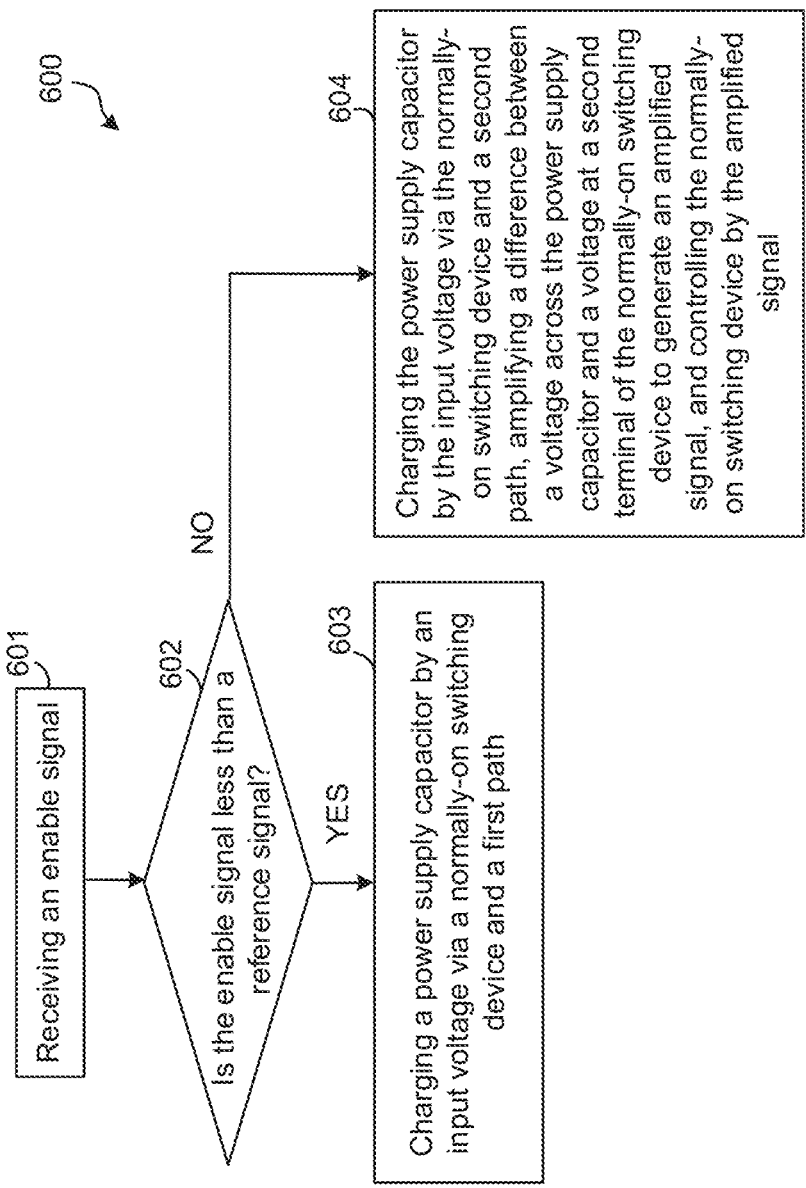

600

601 Receiving an enable signal

602 Is the enable signal less than a reference signal?

YES 603 Charging a power supply capacitor by an input voltage via a normally-on switching device and a first path

NO

604 Charging the power supply capacitor by the input voltage via the normally-on switching device and a second path, amplifying a difference between a voltage across the power supply capacitor and a voltage at a second terminal of the normally-on switching device to generate an amplified signal, and controlling the normally-on switching device by the amplified signal

FIG. 8

INTEGRATED CIRCUIT, ASSOCIATED START-UP CIRCUIT AND START-UP METHOD THEREOF

CROSS-REFERENCE TO RELATED APPLICATIONS

This application claims the benefit of CN application 202310995140.6, filed on Aug. 8, 2023, and incorporated herein by reference.

BACKGROUND OF THE INVENTION

1. Field of the Invention

The present invention generally relates to electronic circuits, and more particularly but not exclusively relates to integrated circuits for switching power supply circuits.

2. Description of Related Art

For high voltage (e.g., hundreds or even thousands of volts) applications, a cascode structure having a normally-on switching device and a normally-off switching device connected in series is widely used. In one example, the normally-on switching device is a junction filed effect transistor (JFET), and the normally-off switching device is a metal oxide semiconductor filed effect transistor (MOSFET). FIG. 1 schematically illustrates a typical cascode structure 100 having a JFET J1 and a MOSFET M1. The JFET J1 is the normally-on switching device having an operating voltage of hundreds to thousands of volts, and the MOSFET M1 is the normally-off switching device having an operating voltage of several to tens of volts (e.g., 28V). The normally-on switching device generally means that the device is in a conducting state (i.e., on state) when no voltage (e.g., no negative voltage) is applied to a control terminal of the device (e.g., no negative gate-source voltage is applied to a gate of the JFET). The normally-off switching device generally means that the device is in an off state when no voltage (e.g., no positive voltage) is applied to the control terminal of the device (e.g., no positive gate-source voltage is applied to a gate of the MOSFET).

As shown in FIG. 2, in an integrated circuit (IC) 200, the cascode structure having the JFET J1 and the MOSFET M1, and its control circuit may be integrated together on a single die, or may be co-packaged together into one package. The control circuit is employed to control (e.g., turn on and turn off) the JFET J1 and the MOSFET M1. During start-up, the IC 200 has not been powered-up, and a power supply capacitor C1 coupled to a power supply pin VCC of the IC 200 is charged through the JFET J1. In practice, users may not know a detailed distribution of a threshold (e.g., a pinch-off threshold) of the JFET J1, as well as a gate-source capacitance and a gate-drain capacitance of the JFET J1. Therefore, if a gate of the JFET J1 is grounded and the threshold of the JFET J1 is low, then a voltage across the power supply capacitor C1 could not be charged to a desired value.

SUMMARY OF THE INVENTION

It is one of the objects of the present invention to provide an integrated circuit for a switching power supply circuit, as well as a start-up circuit and a start-up method thereof.

One embodiment of the present invention discloses an integrated circuit for a switching power supply circuit. The integrated circuit for a switching power supply circuit has an enable pin, a power supply pin, a switch pin, a ground pin, a power switch, and an amplifier. The enable pin is configured to receive an enable signal. The power supply pin is configured to be coupled to a power supply capacitor. The switch pin is configured to receive an input voltage. The power switch has a normally-on switching device and a normally-off switching device. The normally-on switching device has a first terminal, a second terminal, and a control terminal. The first terminal of the normally-on switching device is coupled to the switch pin. The normally-off switching device has a first terminal, a second terminal, and a control terminal. The first terminal of the normally-off switching device is coupled to the second terminal of the normally-on switching device, and the second terminal of the normally-off switching device is coupled to the ground pin. The amplifier is configured to amplify a difference between a voltage at the power supply pin and a voltage at the second terminal of the normally-on switching device and configured to provide an amplified signal at an output terminal of the amplifier to control the normally-on switching device.

Another embodiment of the present invention discloses a start-up method for an integrated circuit. The method comprises the following steps. First, coupling a normally-on switching device and a normally-off switching device in series. The normally-on switching device has a first terminal, a second terminal, and a control terminal. The normally-off switching device has a first terminal, a second terminal, and a control terminal. The first terminal of the normally-off switching device is coupled to the second terminal of the normally-on switching device. Second, receiving an enable signal. Third, comparing the enable signal with a reference signal. And then, charging a power supply capacitor during start-up of the integrated circuit. When the enable signal is less than the reference signal, activating a first path and charging the power supply capacitor by an input voltage via the normally-on switching device and the first path. When the enable signal is larger than the reference signal, activating a second path and charging the power supply capacitor by the input voltage via the normally-on switching device and the second path.

Yet another embodiment of the present invention discloses a start-up circuit for an integrated circuit. The start-up circuit used in an integrated circuit for a switching power supply circuit have a normally-on switching device and a normally-off switching device coupled in series. The start-up circuit includes a current path and a comparator. The current path is configured to be coupled between a power supply pin of the integrated circuit and a connection node of the normally-on switching device and the normally-off switching device. The power supply pin is configured to be coupled to a power supply capacitor. The comparator is configured to compare the voltage across the power supply capacitor with a first reference threshold. When an enable signal received at an enable pin of the integrated circuit is less than a reference signal, the current path provides a first charge current to the power supply capacitor. When the enable signal is larger than the reference signal, the current path provides a second charge current to the power supply capacitor, wherein the second charge current is higher than the first charge current.

These and other features of the present invention will be readily apparent to persons of ordinary skill in the art upon reading the entirety of this disclosure, which comprises the accompanying drawings and claims.

BRIEF DESCRIPTION OF DRAWINGS

The present invention can be further understood with reference to the following detailed description and the appended drawings, wherein like elements are provided with like reference numerals.

FIG. 8 schematically illustrates a start-up method 600 for an IC in accordance with an embodiment of the present invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Reference to "one embodiment", "an embodiment", "an example" or "examples" means: certain features, structures, or characteristics are contained in at least one embodiment of the present invention. These "one embodiment", "an embodiment", "an example" and "examples" are not necessarily directed to the same embodiment or example. Furthermore, the features, structures, or characteristics may be combined in one or more embodiments or examples. In addition, it should be noted that the drawings are provided for illustration, and are not necessarily to scale. And when an element is described as "connected" or "coupled" to another element, it can be directly connected or coupled to the other element, or there could exist one or more intermediate elements. In contrast, when an element is referred to as "directly connected" or "directly coupled" to another element, there is no intermediate element. When a signal is described as "equal to" another signal, it is substantially identical to the other signal.

Figure 1:
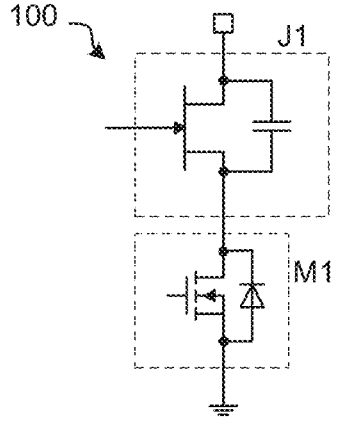
FIG. 1 schematically illustrates a typical cascode structure 100 having a JFET J1 and a MOSFET M1.
Figure 2:
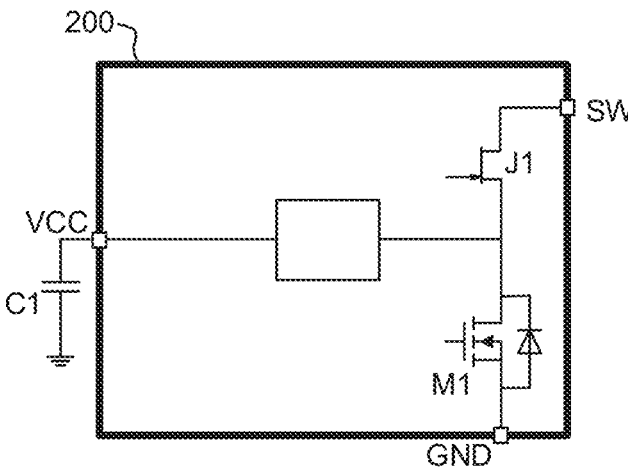
FIG. 2 schematically illustrates an integrated circuit (IC) 200.
Figure 3:
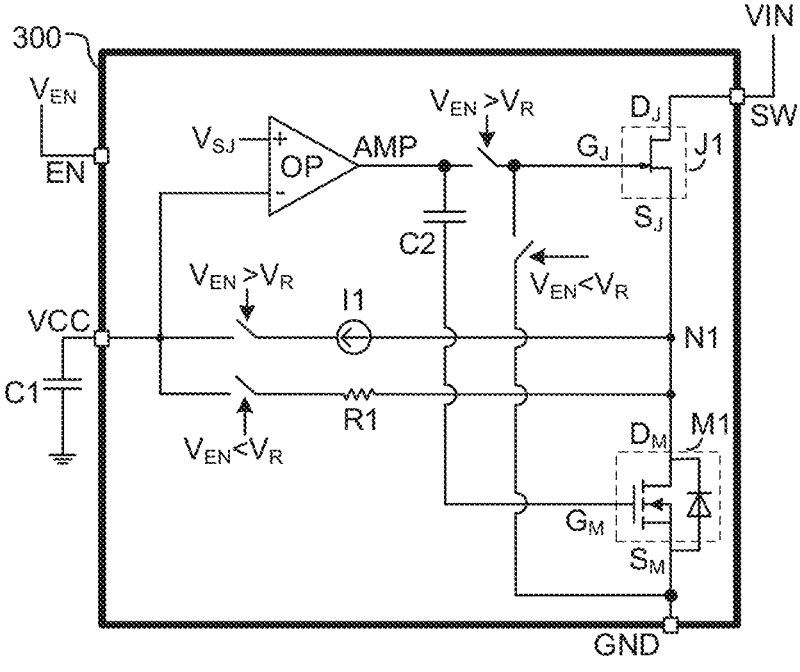
FIG. 3 schematically illustrates an IC 300 and corresponding external circuit for a switching power supply circuit in accordance with an embodiment of the present invention.

FIG. 3 schematically illustrates an integrated circuit (IC) 300 and corresponding external circuit for a switching power supply circuit in accordance with an embodiment of the present invention. As shown in FIG. 3, the IC 300 comprises a power switch. The power switch has a normally-on switching device J1 and a normally-off switching device M1. In one example, the normally-on switching device is a junction field effect transistor (JFET) J1. The power switch may be disposed in the IC 300 (e.g., as shown in the bold solid block of FIG. 3), while other circuit elements (e.g., power supply capacitor C1) are disposed outside the IC. As shown in FIG. 3, the switching power supply circuit comprises the IC 300 and the other elements (i.e., corresponding external circuit). Similarly, in FIG. 4 to FIG. 6, the IC for the switching power supply circuit indicates elements and structures within the bold solid block, and the switching power supply circuit comprises the IC and elements disposed outside the IC (i.e., corresponding external circuit). The IC has an enable pin EN configured to receive an enable signal $V_{EN}$, a power supply pin VCC coupled to a power supply capacitor C1, a switch pin SW configured to receive an input voltage VIN, and a ground pin GND. The normally-on switching device J1 has a first terminal $D_J$ coupled to the switch pin SW, a control terminal $G_J$ and a second terminal $S_J$. The normally-off switching device M1 has a first terminal $D_M$ coupled to a second terminal $S_J$ of the normally-on switching device J1, a control terminal $G_M$, and a second terminal $S_M$ coupled to the ground pin GND. The IC 300 further comprises an amplifier (such as an operational amplifier) OP. The amplifier OP amplifies a difference between a voltage at the power supply pin VCC and a voltage $V_{SJ}$ at the second terminal $S_J$ of the normally-on switching device J1, and generates an amplified signal AMP at an output terminal of the amplifier OP for controlling the normally-on switching device J1 (e.g., via supplying the amplified signal AMP to a control terminal $G_J$ of the normally-on switching device J1). Herein, the voltage $V_{SJ}$ also represents (is the same as) the voltage at a common node (shown as N1 in FIG. 3) of the normally-on switching device and the normally-off switching device.

Although the embodiment shown in FIG. 3 illustrates a case that the JFET J1 and the MOSFET M1 are disposed inside the IC, according to other embodiments of the present invention, either the JFET or the MOSFET, or even both the JFET J1 and MOSFET M1 may be disposed outside the IC.

In the embodiment shown in FIG. 3, the IC 300 further comprises a compensation capacitor C2. The compensation capacitor C2 is coupled between the output terminal of the amplifier OP and a control terminal $G_M$ of the normally-off switching device M1.

During start-up of the IC 300, the enable pin EN receives the enable signal $V_{EN}$. When the enable signal $V_{EN}$ is less than a reference signal $V_R$, a first path (e.g., via a resistor R1 shown in FIG. 3) is enabled (i.e., activated), the power supply capacitor C1 is charged by the input voltage VIN via the normally-on switching device J1 and the first path, and the control terminal $G_J$ of the normally-on switching device J1 is coupled to the ground pin GND. When the enable signal $V_{EN}$ is larger than the reference signal $V_R$, a second path (e.g., via a current source I1 shown in FIG. 3) is enabled (i.e., activated), the power supply capacitor C1 is charged by the input voltage VIN via the normally-on switching device J1 and the second path. Meanwhile, the amplifier OP amplifies the difference between the voltage at the power supply pin VCC and the voltage $V_{SJ}$ at the second terminal $S_J$ of the normally-on switching device J1, and generates the amplified signal AMP at the output terminal of the amplifier OP. The amplified signal AMP is used to control the normally-on switching device J1 (i.e., the control terminal $G_J$ of the normally-on switching device J1 is coupled to the output terminal of the amplifier OP). During the period that the power supply capacitor C1 is being charged, the voltage at the power supply pin VCC slowly increases to the voltage $V_{SJ}$ at the second terminal $S_J$ of the normally-on switching device J1, and the amplified signal AMP gradually decreases, such that the voltage at the control terminal $G_J$ of the normally-on switching device J1 gradually decreases. Accordingly, the voltage at the first terminal $D_M$ of the normally-off switching device M1 decreases too. Thus, the voltage at the power supply pin VCC is clamped to the voltage $V_{SJ}$ at the second terminal $S_J$ of the normally-on switching device J1. After the start-up of the IC is completed, the enable signal $V_{EN}$ at the enable pin EN may be removed (e.g., the enable pin EN is pulled low). The voltage at the power supply pin VCC may be maintained by other means (e.g., by means of supplying power through an auxiliary winding, etc.), and the control terminal $G_J$ of the normally-on switching device J1 may be coupled to the ground pin GND.

Embodiments of the present invention discloses a start-up circuit for an IC. The start-up circuit comprises a first path, a second path and an amplifier OP. During start-up of the IC, at least one of the first path and the second path is activated to charge a power supply capacitor of the IC. When the enable signal $V_{EN}$ is less than the reference signal $V_R$, the first path is activated, and the power supply capacitor C1 is charged by the input voltage VIN via the normally-on switching device J1 and the first path. When the enable signal $V_{EN}$ is larger than the reference signal $V_R$, the second path is activated, the power supply capacitor C1 is charged by the input voltage VIN via the normally-on switching device J1 and the second path. Moreover, when the enable signal $V_{EN}$ is larger than the reference signal $V_R$, the amplifier OP amplifies the difference between the voltage at the power supply pin VCC and the voltage $V_{SJ}$ at the second terminal of the normally-on switching, and generates the amplified signal AMP at an output terminal of the amplifier OP for controlling the normally-on switching device J1.

Figure 4:
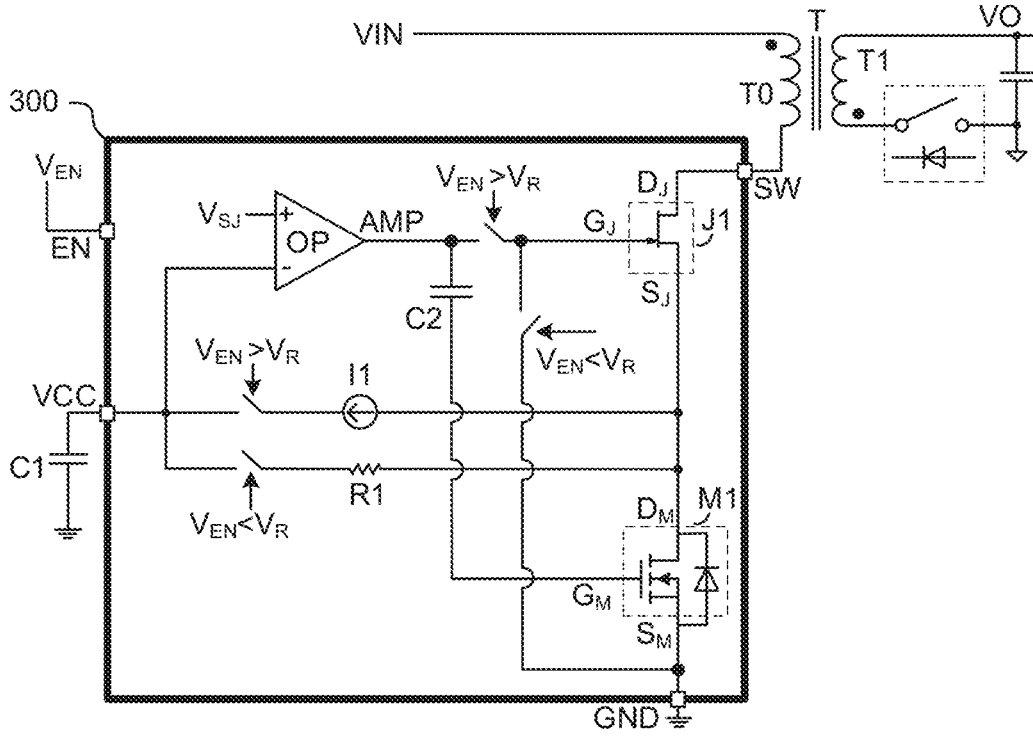
FIG. 4 schematically illustrates an IC 300 and corresponding external circuit for a switching power supply circuit in accordance with an embodiment of the present invention.

FIG. 4 schematically illustrates an IC 300 and corresponding external circuit for a switching power supply circuit in accordance with an embodiment of the present invention. As shown in FIG. 4, the switching power supply circuit comprises a flyback circuit, it means that the IC 300 is capable of forming the flyback circuit in combination with a magnetic element. As shown in FIG. 4, the switch pin SW of the IC is coupled to the magnetic element (such as a primary winding T0 of a transformer T) to receive the input voltage VIN. The transformer T further has a secondary winding T1 coupled to a rectifier switch (or a rectifier diode) and an output capacitor. The flyback circuit provides an output voltage VO under a combined action of the rectifier switch, the normally-on switching device J1 and the normally-off switching device M1.

Figure 5:
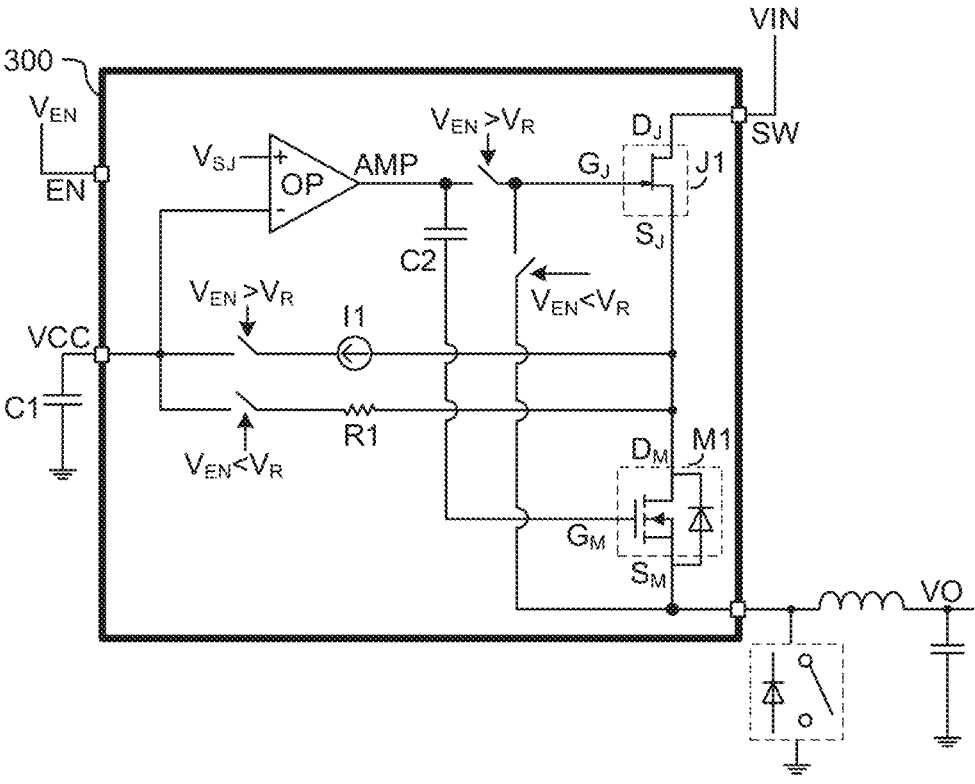
FIG. 5 schematically illustrates an IC 300 and corresponding external circuit for a switching power supply circuit in accordance with an embodiment of the present invention.

FIG. 5 schematically illustrates an IC 300 and corresponding external circuit for a switching power supply circuit in accordance with an embodiment of the present invention. As shown in FIG. 5, the switching power supply circuit comprises a buck circuit, it means that the IC 300 is capable of forming the buck circuit in combination with a freewheeling switch (or a freewheeling diode), a magnetic element and an output capacitor. The switch pin SW of the IC is coupled to the input voltage VIN, and the ground pin GND of the IC is coupled to the freewheeling switch (or the freewheeling diode), the magnetic element and the output capacitor. The buck circuit provides the output voltage VO under a combined action of the freewheeling switch, the normally-on switching device J1 and the normally-off switching device M1.

Two examples of corresponding external circuits of IC are shown in FIG. 4 and FIG. 5. However, those skilled in the art should understand that the corresponding external circuits of IC could also have the other suitable structure for high voltage applications and could charge the power supply capacitor VCC during start-up.

Figure 6:
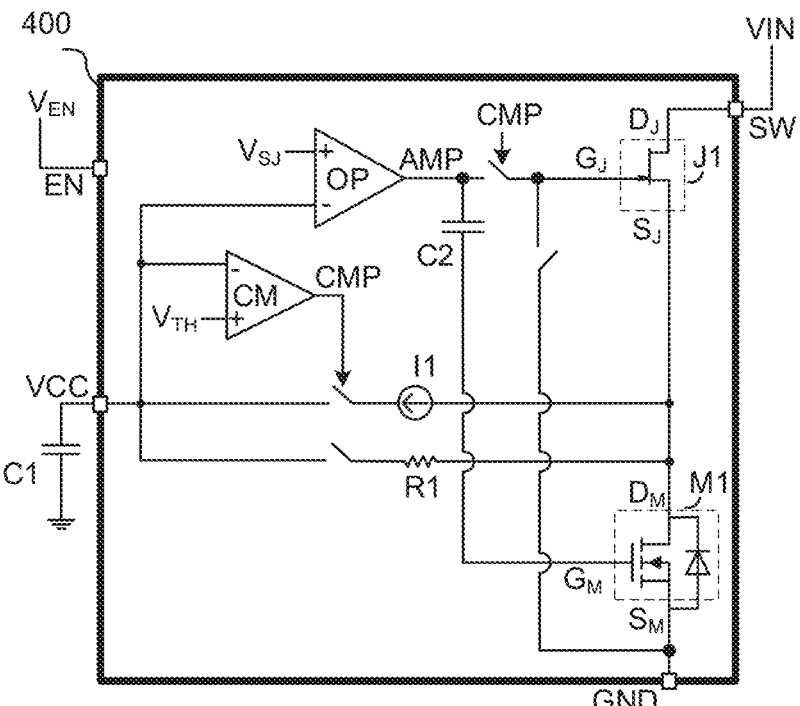
FIG. 6 schematically illustrates an IC 400 and corresponding external circuit for a switching power supply circuit in accordance with an embodiment of the present invention.

FIG. 6 schematically illustrates an IC 400 and corresponding external circuit for a switching power supply circuit in accordance with an embodiment of the present invention. The switching power supply circuit 400 shown in FIG. 6 is similar to the IC 300 shown in FIG. 3, except that the IC 400 shown in FIG. 6 further comprises a comparator CM. The comparator CM is employed to compare the voltage at the power supply pin VCC with a reference threshold $V_{TH}$, and to generate the comparison signal CMP accordingly. When the voltage at the power supply pin VCC is less than the reference threshold $V_{TH}$, the second path is activated, such that the power supply capacitor C1 is charged by the input voltage VIN via the normally-on switching device J1 and the second path, and the control terminal $G_J$ of the normally-on switching device J1 is controlled by the amplified signal AMP.

During normal operations of the IC, if an output current is low (e.g., at a light load state), the IC may enter a sleep mode. During the sleep mode, the power switch does not perform a switching action, the auxiliary winding cannot charge the power supply pin VCC, and the power supply capacitor C1 will be slowly discharged. If a capacitance of the power supply capacitor C1 is small, the voltage at the power supply pin VCC will drop to a lower value, and the power supply capacitor C1 may even be totally discharged. The embodiment shown in FIG. 6 compares the voltage across the power supply capacitor C1 with the reference threshold $V_{TH}$ via the comparator CM. When the voltage across the power supply capacitor C1 is less than the reference threshold $V_{TH}$, the second path is activated, the power supply capacitor C1 is charged by the input voltage VIN via the normally-on switching device J1 and the second path, and the voltage at the power supply pin VCC increases again until it equals the voltage $V_{SJ}$ at the second terminal $S_J$ of the normally-on switching device J1.

In one embodiment of the present invention, if the IC exits the sleep mode, the power switch resumes switching, the IC 400 will deactivate the second path, and the voltage at the power supply pin VCC will continuously be maintained by other means (e.g., charged through the auxiliary winding).

Figure 7:
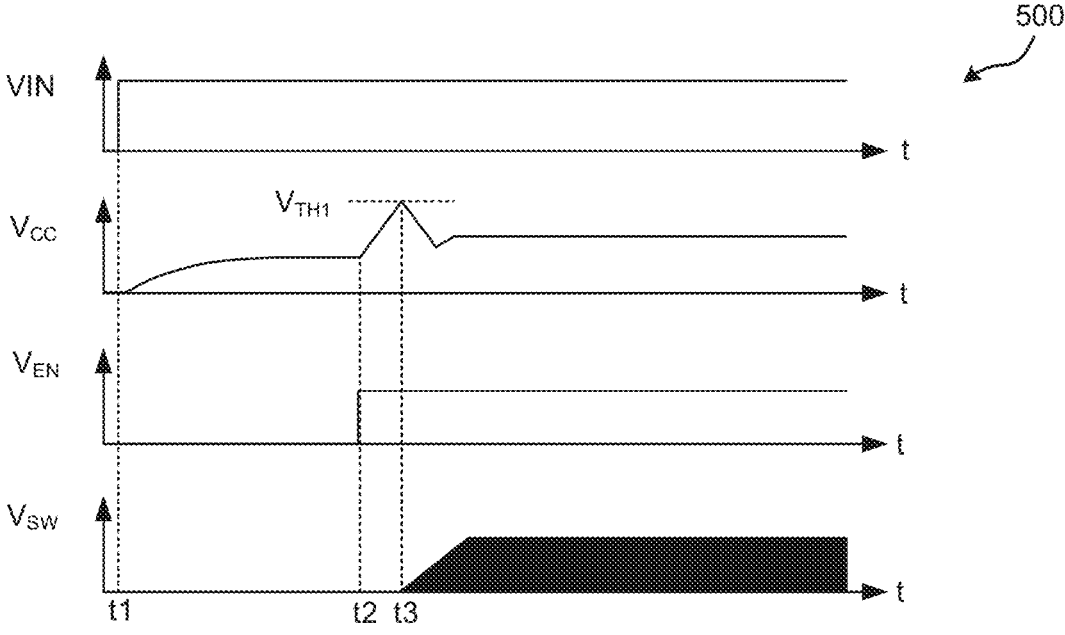
FIG. 7 schematically illustrates a waveform diagram 500 of various signals for controlling an integrated circuit in accordance with an embodiment of the present invention.

FIG. 7 schematically illustrates a waveform diagram 500 of various signals for controlling an IC (e.g., used in the flyback circuit shown in FIG. 4) in accordance with an embodiment of the present invention. In the waveform diagram 500, horizontal axes represent time, VIN represents the input voltage, $V_{CC}$ represents the voltage across the power supply capacitor C1, $V_{EN}$ represents the enable signal, and $V_{SW}$ represents the voltage at the switch pin SW.

As shown in FIG. 7, time period t1-t3 represents the start-up of the IC. At time t1, the input voltage VIN starts to supply power, the enable signal $V_{EN}$ is low level (i.e., the enable signal $V_{EN}$ is smaller than the reference signal $V_R$), the first path is activated to start charging the power supply capacitor C1. During time period t1-t2, the enable signal $V_{EN}$ is smaller than the reference signal $V_R$, and the first current path provides a first charge current to the power supply capacitor C1 (e.g., through the resistor R1). The voltage $V_{CC}$ across the power supply capacitor C1 slowly increases at a first speed as the charging process proceeds. At time t2, the enable signal $V_{EN}$ switches from the low level to a high level (i.e., the enable signal $V_{EN}$ is larger than the reference signal $V_R$), the first path is disactivated, and the second path is activated to charge the power supply capacitor C1. In the meantime, the amplifier OP provides an amplified signal AMP to control the normally-on switching device J1. During time period t2-t3, the enable signal $V_{EN}$ is larger than the reference signal $V_R$, and the second current path provides a second charge current to the power supply capacitor C1 (e.g., through the current source I1), thus the voltage $V_{CC}$ across the power supply capacitor C1 rapidly increases at a second speed. In one embodiment, the first charge current is less than the second charge current. For example, the first charge current at $V_{CC}$=0V could be 2 mA, while the second charge current could be 5 mA. Once the voltage $V_{CC}$ across the power supply capacitor C1 increases to a first reference threshold $V_{TH1}$ (e.g., 15V) at time t3, the start-up of the IC is completed, the second path stops charging the power supply capacitor C1 (i.e., stop providing the second charge current to the power supply capacitor C1). The normally-on switching device J1 and normally-off switching device M1 start switching to transfer energy from the input voltage VIN to output. After time period t3, the power supply capacitor C1 can be charged by other means, e.g. an auxiliary winding. And ahead of the auxiliary winding being capable of providing sufficient energy to power supply capacitor C1, as shown in FIG. 7, there could be a dip on the voltage $V_{CC}$.

FIG. 8 schematically illustrates a start-up method 600 for an IC in accordance with an embodiment of the present invention. The IC comprises a normally-on switching device and a normally-off switching device with a cascode structure. The normally-on switching device has a first terminal, a control terminal, and a second terminal. The normally-off switching device has a first terminal coupled to the second terminal of the normally-on switching device, a control terminal and a second terminal. According to an embodiment of the present invention, the start-up method comprises following steps.

In step 601, receiving an enable signal.

In step 602, comparing the enable signal with a reference signal. When the enable signal is less than the reference signal, go to step 603. And when the enable signal is greater than the reference signal, go to step 604.

In step 603, charging a power supply capacitor by an input voltage via a normally-on switching device and a first path.

In step 604, charging the power supply capacitor by the input voltage via the normally-on switching device and a second path, amplifying a difference between a voltage across the power supply capacitor and a voltage at a second terminal of the normally-on switching device to generate an amplified signal, and controlling the normally-on switching device by the amplified signal.

In one embodiment of the present invention, the compensation capacitor is coupled between the output terminal of the amplifier and the control terminal of the normally-off switching device. When the enable signal is larger than the reference signal, the first path is activated, the control terminal of the normally-on switching device is coupled to the same end of the capacitor as the output terminal of the amplifier.

In one embodiment of the present invention, if the IC enters the sleep mode, comparing the voltage across the power supply capacitor with the reference threshold. When the voltage across the power supply capacitor is less than the reference threshold, the power supply capacitor is charged by the input voltage via the normally-on switching device and the second path.

According to the IC and the method from embodiments of the present invention, by amplifying the difference between the voltage at the power supply pin and the voltage at the second terminal of the normally-on switching device, generating the amplified signal, and using the amplified signal to control the normally-on switching device, the voltage at the power supply pin can be smoothly charged up without being limited by the threshold of the normally-on switching device. Furthermore, even if the threshold of the normally-off switching device is high, the source voltage of the normally-off switching device can be kept low, so the cascoded normally-off switching device can be protected. In addition, the compensation capacitor is coupled between the control terminals of the two switching devices in cascode, which allows stabilization of a clamping state even when the normally-on switching device has a low source gate capacitance. Further, when the system enters the sleep mode, the second path is activated, and the power supply capacitor is charged, ensuring that the system is powered.

Obviously, many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

We claim:

1. An integrated circuit for a switching power supply circuit, comprising:
an enable pin configured to receive an enable signal;
a power supply pin configured to be coupled to a power supply capacitor;
a switch pin configured to receive an input voltage;
a ground pin;
a power switch, comprising a normally-on switching device and a normally-off switching device, wherein the normally-on switching device has a first terminal, a second terminal, and a control terminal, the first terminal of the normally-on switching device is coupled to the switch pin, and wherein the normally-off switching device has a first terminal, a second terminal, and a control terminal, the first terminal of the normally-off switching device is coupled to the second terminal of the normally-on switching device, and the second terminal of the normally-off switching device is coupled to the ground pin; and an amplifier, configured to amplify a difference between a voltage at the power supply pin and a voltage at the second terminal of the normally-on switching device, and configured to provide an amplified signal at an output terminal of the amplifier to control the normally-on switching device.

2. The integrated circuit of claim 1, further comprising:

a compensation capacitor coupled between the output terminal of the amplifier and the control terminal of the normally-off switching device.

3. The integrated circuit of claim 1, wherein:

when the enable signal is less than a reference signal, a first path is activated, and the power supply capacitor is charged by the input voltage via the normally-on switching device and the first path; and when the enable signal is larger than the reference signal, a second path is activated, and the power supply capacitor is charged by the input voltage via the normally-on switching device and the second path.

4. The integrated circuit of claim 3, wherein:

when the enable signal is less than the reference signal, the control terminal of the normally-on switching device is coupled to the ground pin; and when the enable signal is larger than the reference signal, the control terminal of the normally-on switching device is coupled to the output terminal of the amplifier.

5. The integrated circuit of claim 3, further comprising:

a comparator, configured to compare the voltage at the power supply pin with a reference threshold when the switching power supply circuit is under a sleep mode, and when the voltage at the power supply pin is less than the reference threshold, the second path is activated, the power supply capacitor is charged by the input voltage via the normally-on switching device and the second path.

6. The integrated circuit of claim 1, wherein the switching power supply circuit comprises a flyback circuit, and the integrated circuit is capable of forming the flyback circuit in combination with a magnetic element.

7. A start-up method for an integrated circuit, the method comprising:

coupling a normally-on switching device and a normally-off switching device in series, wherein the normally-on switching device has a first terminal, a second terminal, and a control terminal, the normally-off switching device has a first terminal, a second terminal, and a control terminal, the first terminal of the normally-off switching device is coupled to the second terminal of the normally-on switching device;

receiving an enable signal, wherein the enable signal is configured to control the integrated circuit to be initiated or to be shut down;

comparing the enable signal with a reference signal; and charging a power supply capacitor during start-up of the integrated circuit; wherein when the enable signal is less than the reference signal, activating a first path and charging the power supply capacitor by an input voltage via the normally-on switching device and the first path; and wherein when the enable signal is larger than the reference signal, activating a second path and charging the power supply capacitor by the input voltage via the normally-on switching device and the second path.

8. The start-up method of claim 7, wherein when the enable signal is larger than the reference signal, controlling the normally-on switching device based on a difference between a voltage across the power supply capacitor and a voltage at the second terminal of the normally-on switching device.

9. The start-up method of claim 7, wherein when the enable signal is less than the reference signal, coupling the control terminal of the normally-on switching device to the second terminal of the normally-off switching device.

10. The start-up method of claim 7, further comprising:

comparing a voltage across the power supply capacitor with a reference threshold when the integrated circuit is under a sleep mode; and in response to the voltage across the power supply capacitor being less than the reference threshold, activating the second path and charging the power supply capacitor by the input voltage via the normally-on switching device and the second path.

11. The start-up method of claim 10, further comprising:

in response to the voltage across the power supply capacitor being increased above the reference threshold, deactivating the second path.

12. A start-up circuit used in an integrated circuit for a switching power supply circuit with a normally-on switching device and a normally-off switching device coupled in series, the start-up circuit comprising:

a current path configured to be coupled between a power supply pin of the integrated circuit and a connection node of the normally-on switching device and the normally-off switching device, wherein the power supply pin is configured to be coupled to a power supply capacitor; and a comparator configured to compare a voltage across the power supply capacitor with a first reference threshold;

wherein when an enable signal received at an enable pin of the integrated circuit is less than a reference signal, the current path provides a first charge current to the power supply capacitor; and wherein when the enable signal is larger than the reference signal, the current path provides a second charge current to the power supply capacitor, wherein the second charge current is higher than the first charge current, and the enable signal is configured to control the integrated circuit to be initiated or to be shut down.

13. The start-up circuit of claim 12, wherein the current path includes a first path and a second path respectively providing the first charge current and the second charge current, and wherein:

when the enable signal is less than the reference signal, the first path is activated, and the power supply capacitor is charged by an input voltage via the normally-on switching device and the first path; and wherein when the enable signal is larger than the reference signal, the second path is activated, the power supply capacitor is charged by the input voltage via the normally-on switching device and the second path.

14. The start-up circuit of claim 13, wherein the first path includes a resistor, and the second path includes a current source.

15. The start-up circuit of claim 13, wherein the comparator further compares the voltage across the power supply capacitor with a second reference threshold when the integrated circuit is under a sleep mode, and wherein when the voltage across the power supply capacitor decreases to the second reference threshold, the second path is activated, the power supply capacitor is charged by the input voltage via the normally-on switching device and the second path.

16. The start-up circuit of claim 12, further comprising:

an amplifier, configured to amplify a difference between the voltage across the power supply capacitor and a voltage at the common node of the normally-on switching device and the normally-off switching device, and configured to provide an amplified signal at an output terminal of the amplifier to control the normally-on switching device.

17. The start-up circuit of claim 16, further comprising:

a compensation capacitor, configured to be coupled between the output terminal of the amplifier and a control terminal of the normally-off switching device.

18. The start-up circuit of claim 12, wherein once the voltage across the power supply capacitor increase to the first reference threshold, the charge path stops providing current to the power supply capacitor, and the normally-on switching device and normally-off switching device start switching.

19. The start-up circuit of claim 12, wherein the integrated circuit includes at least one of the normally-on switching device and normally-off switching device, and a control circuit for controlling the normally-on switching device and normally-off switching device.

20. The start-up circuit of claim 12, wherein:

the normally-off switching device has a first terminal, a second terminal, and a control terminal, the first terminal of the normally-off switching device is configured to be coupled to the normally-on switching device;

when the enable signal is less than the reference signal, the start-up circuit is configured to connect a control terminal of the normally-on switching device to the second terminal of the normally-off switching device; and when the enable signal is larger than the reference signal, the start-up circuit is configured to connect an output terminal of the amplifier to the control terminal of the normally-on switching device.

\* \* \* \* \*